United States Patent
Boss (10) Patent No.: US 11,280,841 B2
(45) Date of Patent: *Mar. 22, 2022

(54) ESTIMATING A TEMPERATURE OF AN ELECTROCHEMICAL BATTERY

(71) Applicant: NOVUM engineerING GmbH, Dresden (DE)

(72) Inventor: Valentin Boss, Dresden (DE)

(73) Assignee: NOVUM ENGINEERING GMBH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/077,913

(22) Filed: Oct. 22, 2020

(65) Prior Publication Data
US 2021/0123815 A1 Apr. 29, 2021

(30) Foreign Application Priority Data
Oct. 23, 2019 (EP) .................................. 19 204 754

(51) Int. Cl.
*G01R 31/389* (2019.01)
*G01R 31/3835* (2019.01)
(Continued)

(52) U.S. Cl.
CPC ......... *G01R 31/389* (2019.01); *G01R 31/367* (2019.01); *G01R 31/3835* (2019.01);
(Continued)

(58) Field of Classification Search
None
See application file for complete search history.

(56) References Cited

U.S. PATENT DOCUMENTS

| 4,678,998 A | 7/1987 | Muramatsu |
| 6,294,897 B1 * | 9/2001 | Champlin ........... H02J 7/00047 320/153 |

(Continued)

FOREIGN PATENT DOCUMENTS

| DE | 112015005201 T5 | 7/2017 |
| DE | 112016002873 T5 | 3/2018 |

(Continued)

OTHER PUBLICATIONS

Hussein et al., "An Adaptive Sensorless Measurement Technique for Internal Temperature of Li-ion Batteries Using Impedance Phase Spectroscopy", Sep. 23-27, 2018, IEEE Energy Conversion Congress and Exposition, pp. 3555-35559 (Year: 2018).*

(Continued)

*Primary Examiner* — Brent A. Fairbanks
(74) *Attorney, Agent, or Firm* — Fenwick & West LLP (57) ABSTRACT

A computer-implemented method and a temperature estimating system for estimating a temperature of an electrochemical battery, including: providing a series of electrical impedance measurements of an electrochemical battery, each electrical impedance measurement being measured at a respective measurement frequency, the series being ordered according to the respective measurement frequencies; and determining a temperature of the electrochemical battery using artificial neural network means configured to receive as inputs a series of electrical impedance values, wherein a series of electrical impedance values is provided to the artificial neural network means, the series of electrical impedance values corresponding to the provided series of electrical impedance measurements, wherein the artificial neural network means receives and processes the provided series of electrical impedance values to generate therefrom (Continued)

an output signal representing a temperature associated with the electrochemical battery.

8 Claims, 4 Drawing Sheets

(51) Int. Cl.
    *G01R 31/367*     (2019.01)
    *G06N 3/02*     (2006.01)
    *G01K 7/16*     (2006.01)

(52) U.S. Cl.
    CPC ............... *G06N 3/02* (2013.01); *G01K 7/16* (2013.01); *G01K 2217/00* (2013.01)

(56) References Cited

U.S. PATENT DOCUMENTS

| | | | |
|---|---|---|---|
| 6,307,378 B1 | 10/2001 | Kozlowski | |
| 8,994,340 B2 | 3/2015 | Matthe et al. | |
| 2003/0184307 A1 | 10/2003 | Kozlowski et al. | |
| 2008/0234956 A1* | 9/2008 | Mizuno | G01R 31/367 702/63 |
| 2013/0069660 A1* | 3/2013 | Bernard | G01R 31/367 324/430 |
| 2013/0307487 A1 | 11/2013 | Matthe et al. | |
| 2013/0314049 A1* | 11/2013 | van Lammeren | G01K 7/26 320/134 |
| 2014/0372055 A1* | 12/2014 | Wang | G01R 31/3842 702/63 |
| 2018/0086222 A1* | 3/2018 | Juang | H02J 7/0063 |
| 2018/0217209 A1* | 8/2018 | Marsili | G01R 31/389 |
| 2019/0120910 A1* | 4/2019 | Ghantous | G01R 31/392 |
| 2019/0157891 A1* | 5/2019 | Chemali | G06N 3/04 |
| 2020/0300920 A1* | 9/2020 | Christophersen | H01M 10/48 |

FOREIGN PATENT DOCUMENTS

| | | |
|---|---|---|
| DE | 112016003789 T5 | 5/2018 |
| EP | 1129343 B1 | 6/2008 |
| EP | 1702219 B1 | 5/2012 |
| JP | 2003-249271 A | 9/2003 |
| JP | 4038788 B2 | 1/2008 |
| WO | WO 00/16083 A1 | 3/2000 |
| WO | WO 03/071617 A2 | 8/2003 |
| WO | WO 2005/059579 A1 | 6/2005 |
| WO | WO 2016/080111 A1 | 5/2016 |
| WO | WO 2016/208745 A1 | 12/2016 |
| WO | WO 2017/110437 A1 | 6/2017 |

OTHER PUBLICATIONS

European Patent Office, Extended European Search Report and Opinion, European Patent Application 19204754.6, dated May 25, 2020, nine pages.

* cited by examiner

ESTIMATING A TEMPERATURE OF AN ELECTROCHEMICAL BATTERY

CROSS-REFERENCE TO RELATED APPLICATION

This application claims priority to European Patent Application No. 19 204 754.6, filed on Oct. 23, 2019, which is incorporated by reference herein in its entirety.

BACKGROUND

The invention relates to a computer-implemented method of estimating a temperature of an electrochemical battery. Furthermore, the invention relates to a temperature estimating system for estimating a temperature of an electrochemical battery.

For example, the computer may be a microcontroller. For example, the computer or microcontroller may include a processing unit, a memory, and input/output ports.

WO 2005/059579 A1 and EP 1702219 B1 describe an apparatus and a method for estimating a state of charge of a battery by using a neural network. The apparatus includes a sensing section for detecting current, voltage and a temperature from a battery cell and a neural network performing a neural network algorithm and a learning algorithm based on data of the current, voltage and temperature transmitted thereto from the sensing section and present time data.

U.S. Pat. No. 4,678,998 A describes a battery condition monitor and a monitoring method. The monitor includes a computer for computing internal impedances of the storage battery from different frequency components of voltage and amperage signals from the battery. In an example, it is suggested to detect the temperature of a storage battery in order to perform a temperature compensation for the internal impedance of the storage battery.

JP 2003-249271 A and JP 4038788 B2 describe the determining of a deterioration state and a residual capacity of a battery in real time. In an example, as an operation parameter of the battery under operation, a measurement unit can measure and sample periodically the voltage of the battery, the current, the internal impedance, and the temperature.

U.S. Pat. No. 6,307,378 B1 describes a method and an apparatus for measurement of electrochemical cell and battery impedances.

WO 03/071617 A2 describes a method for determining a condition parameter of an electrochemical cell, such as in a battery. In an example, measurement signals such as terminal voltages, cell voltages, load current, charging current, ambient temperature, battery surface temperature, terminal temperature, internal battery temperature, and impedance signals are passed to a feature extraction processing algorithm, which generates a feature vector and a feature flag. Data from the feature vector is passed to a neural network ISOC predictor for initial battery capacity state of charge estimation, and a neural network CSOC predictor for continuous prediction of SOC during operation. In another example, the information contained in a feature vector is used by a neural network SOH classifier, a linear/statistical SOH classifier, and a fuzzy logic SOH classifier for state of health classification.

WO 2016/208745 A1 and its translation DE 112016002873 T5 describe a method of recognizing the state of charge or depth of discharge of a battery. The method includes determining the complex impedance between the positive and negative electrodes of a battery with respect to a plurality of frequencies.

WO 2017/110437 A1 and its translation DE 11 2016 003 789 T5 describe an estimation device that estimates the residual capacity of a lithium ion battery.

WO 2016/080111 A1 and its translation DE 11 2015 005 201 T5 describe an estimation device for estimating a remaining stored power amount of a storage battery. In an example, a storage battery management device measures the environmental temperature of the storage battery.

US 2013/0307487 A1 and U.S. Pat. No. 8,994,340 B2 describe a method and a system for determining the temperature of cells in a battery pack, without using temperature sensors, by measuring the impedance of the cells and using the impedance to determine the temperature. An AC voltage signal is applied to the battery pack, and a time sample of voltage and current data is provided. A fast Fourier transformation is performed on the time windowed voltage and current data to identify voltage and current magnitudes at one or more specific frequencies. The voltage and current magnitudes are used to determine the impedance at the one or more frequencies. Finally, the impedance is used to determine the temperature of the cell or cells using a look-up table, where the impedance, the frequency, and a state of charge are used as input parameters for the look-up.

WO 00/16083 and EP 1129343 B1 describe a device that measures real and imaginary parts of complex immittance of a cell or battery at n discrete frequencies. The device determines cell/battery properties by evaluating components of an equivalent circuit model. The document includes a suggestion that a battery temperature could similarly be determined based on the complex immittance spectra of the battery.

Conventional methods of determining battery properties, such as the state of charge, are known in which the temperature of the battery is sensed and used as an input for estimating the state of charge.

The conventional method of US 2013/0307487 A1 U.S. Pat. No. 8,994,340 B2, which determine a battery temperature from a look-up table using an impedance as an input parameter for the look-up, must be specifically adapted for a particular battery and requires also the state of charge as an input parameter for the look-up. Moreover, the method only uses a magnitude of the impedance, which is calculated by dividing the voltage amplitude by the current amplitude at the respective frequency.

SUMMARY OF THE INVENTION

It is an object of the invention to provide a novel method of estimating a temperature of an electrochemical battery based on electrical impedance measurements, in particular, the temperature of a rechargeable electrochemical battery. It is desirable that the method allows for a robust estimation. It is also desirable that the method does not necessarily require the state of charge as an input parameter for the estimating.

The invention is indicated in the independent claims. Further embodiments are indicated in the dependent claims.

According to one aspect of the invention, there is provided a computer-implemented method of estimating a temperature of an electrochemical battery, the method comprising: providing a series of electrical impedance measurement of an electrochemical battery, each electrical impedance measurement being measured at a respective measurement frequency, the series being ordered according to the respective measurement frequencies, determining a temperature of the electrochemical battery using artificial neural network mean configured to receive as inputs a series of electrical impedance values, wherein a series of electrical impedance values is provided to the artificial neural network means, the series of electrical impedance values corresponding to the provided series of electrical impedance measurements, wherein the artificial neural network means receives and processes the provided series of electrical impedance values to generate therefrom an output signal representing a temperature associated with the electrochemical battery.

The series of electrical impedance values corresponds to the provided series of electrical impedance measurements. That is, both series characterize a same curve progression of the electrical impedance in the complex plane over the index of elements of the respective series. Herein, the term "complex plane", unless specified otherwise, is to be understood as the complex plane of electrical impedance.

In particular, the series of electrical impedance values is provided based on the provided series of electrical impedance measurements.

For example, the provided series of electrical impedance values may be identical to or may be included in the provided series of electrical impedance measurements, or may be generated from the provided series of electrical impedance measurements.

For example, generating the series of electrical impedance values from the provided series of electrical impedance measurements may include at least one of interpolating between electrical impedance measurements, selecting from the electrical impedance measurements, and extrapolating the electrical impedance measurements.

The artificial neural network means may receive and process the series of electrical impedance values to generate therefrom the output signal in accordance with a predetermined processing structure of the artificial neural network means.

For example, the artificial neural network means may have been trained to estimate a temperature of a (rechargeable) electrochemical battery by detecting characteristic features of a series of electrical impedance values, using training data for temperatures of a predetermined temperature range, and for different states of health and/or different states of charge of the batteries.

Preferably, the electrochemical battery is a rechargeable electrochemical battery.

For many applications, in particular of a rechargeable electrochemical battery, knowledge of the battery temperature of an electrochemical battery is of high importance. However, a precise, direct measurement of an internal battery cell temperature or battery temperature is difficult to realize and requires at least one temperature sensor to be included in the battery.

By estimating the temperature of the battery using the artificial neural network means, the battery temperature may be estimated based on the provided series of electrical impedance measurements (that is, based on the corresponding series of electrical impedance values). In particular, the battery temperature may be estimated based solely on values that correspond to direct measurements, in particular, direct electrical measurements, such as the provided series of electrical impedance measurements. For example, a state of charge is not required as an input of the artificial neural network means. And, for example, the method may be applied to the electrochemical battery at different states of charge of the battery.

Thus, the method allows for estimating the temperature of the battery with a high robustness.

The method operates on measurement data in the form of electrical impedance measurements of an electrochemical battery, in order to generate an output signal representing a temperature associated with the electrochemical battery.

The electrical impedance may also be termed a complex electrical impedance and may be a complex number and may be provided being expressed in a unit of electrical resistance, for example, ohm.

For example, each electrical impedance measurement of the provided series of electrical impedance measurements may be or include a complex number that defines a real part and an imaginary part of the respective electrical impedance. The electrical impedance may also be represented in polar form, defining a magnitude (or amplitude) and an angle (or phase).

For example, the electrical impedance measurements of the provided series of electrical impedance measurements may be in the form of respective complex representations (complex numbers). Or, for example, the electrical impedance measurements may each be in the form of amplitude and phase, and the step of providing may comprise converting the electrical impedance measurements into electrical impedance measurements in the form of respective complex representations of the electrical impedance measurements. A "complex representation" of an electrical impedance measurement comprises a complex number. For example, the complex representation of an electrical impedance measurement may be a complex number.

Herein, the term "battery" is to be understood as including a battery cell. The battery may include one or more battery cells. In particular, the term "battery" includes a battery cell as well as a battery composed of multiple battery cells.

Specifically, the electrochemical battery is understood as defining a device consisting of one or more electrochemical cells with external electrical connections. For example, the battery may include two external electrical connections for drawing power from the one or more electrochemical cells and, in case of a rechargeable electrochemical battery, for (re-)charging the one or more electrochemical cells.

For example, the respective measurement frequency may be a frequency of a signal input to the electrochemical battery. For example, the signal may be a sinusoidal signal.

Preferably, each electrical impedance value of the provided series of electrical impedance values comprises a complex number that defines a real part and an imaginary part of a respective electrical impedance.

The elements of the series of electrical impedance values are fed to corresponding inputs of the artificial neural network means. Thus, an automated battery temperature estimation based on the provided series of electrical impedance values is made possible.

Preferably, the series of electrical impedance measurements are provided in the form of a digital signal.

Preferably, the series of electrical impedance measurements of the electrochemical battery are provided in a digitally represented form.

The series of electrical impedance measurements may be received from an electrical impedance measuring unit or electrical impedance measuring means, for example.

Providing the series of electrical impedance measurements may comprise receiving the electrical impedance measurements of the series one after another.

The series of electrical impedance measurements may be communicated to a temperature estimating system comprising means for carrying out the steps of the method. The system may be configured for providing (including receiving) the communicated electrical impedance measurements.

In one or more embodiments, the measurement frequencies are assumed to be logarithmically equidistantly spaced. Preferably, the measurement frequencies are logarithmically equidistantly spaced over at least four decades of the measurement frequency range (the frequency range of the measurement frequencies), more preferably over at least five decades of the measurement frequency range.

Preferably, the measurement frequencies include a measurement frequency in the range of 0.1 to 1.0 Hz.

Preferably, the measurement frequencies include a measurement frequency in the range of 1 kHz to 10 kHz.

Preferably, the measurement frequencies include at least 4 (four) measurement frequencies per decade of the measurement frequency range, more preferably at least five measurement frequencies per decade of the measurement frequency range.

The step of providing the series of electrical impedance measurements may comprise receiving a plurality of electrical impedance measurements, each electrical impedance measurement being measured at a respective measurement frequency, and:
  arranging the plurality of electrical impedance measurements according to the associated measurement frequencies to provide the series of electrical impedance measurements, or
  providing the plurality of the electrical impedance measurements as the series of electrical impedance measurements.

For example, the arranged plurality of electrical impedance measurements, optionally including the respective measurement frequencies, may be provided as the series of electrical impedance measurements.

The plurality of electrical impedance measurements, or the series of electrical impedance measurements may be received in the form of an electrical impedance spectrum.

In the series of electrical impedance measurements, for example, the electrical impedance measurements may include the respective measurement frequencies. For example, each electrical impedance measurement may include the measured value of the electrical impedance and the measurement frequency. However, the electrical impedance measurements may as well be in the form of respective electrical impedances, represented as respective complex numbers, or each represented as an amplitude and phase.

An output signal is generated that represents a temperature associated with the electrochemical battery. For example, the at least one output signal may represent a classification and/or an estimation of a battery temperature.

For example, the output signal may be transmitted or communicated or output to an output unit for outputting the signal, and/or for outputting a visual signal based on the output signal. The visual signal may be displayed.

Preferably, the provided series of electrical impedance values has a predetermined number of elements. For example, the number of elements may correspond to a number of inputs of the artificial neural network means for receiving the series of electrical impedance values.

For example, generating the series of electrical impedance values from the provided series of electrical impedance measurements may include adjusting the number of elements of the series of electrical impedance measurements to the predetermined number of elements.

For example, the series of electrical impedance values may be generated from the provided series of electrical impedance measurement by adjusting the number of elements of the series of electrical impedance measurements to the predetermined number of elements.

For example, the method may comprise: if the number of elements of the provided series of electrical impedance measurements is different from the predetermined number of elements, adjusting the number of elements of the series of electrical impedance measurements to the predetermined number of elements.

In one or more embodiments, the method may comprise adjusting the number of elements of the series of electrical impedance measurements or adjusting the number of elements of the series of electrical impedance values to a predetermined number of elements.

Thus, the number of elements may be adjusted to a corresponding number of inputs of the artificial neural network means for receiving the series of electrical impedance values.

For example, the predetermined number of elements may be the predetermined number of elements of the series of electrical impedance values.

For example, the number of elements of the series of electrical impedance values may be adjusted to a predetermined number of elements by adjusting the number of elements of the series of electrical impedance measurements to the predetermined number of elements.

For example, adjusting the number of elements of the series of electrical impedance measurements or the number of elements of the series of electrical impedance values may comprise at least one of interpolating between electrical impedance measurements, selecting from the electrical impedance measurements, and extrapolating the electrical impedance measurements. In the adjusting step, the number of elements may be increased, maintained, or decreased.

In one or more embodiments, the method further comprises: calculating electrical impedance gradients from the series of electrical impedance measurements to generate a series of electrical impedance gradients, wherein the artificial neural network means is configured to receive as further inputs the series of electrical impedance gradients, wherein the artificial neural network means receives and processes at least the provided series of electrical impedance values and the series of electrical impedance gradients to generate therefrom the output signal representing a temperature associated with the electrochemical battery.

Thus, a series of electrical impedance gradients may be provided for evaluation by the artificial neural network means, which gradients emphasize information about the variation of the electrical impedance dependent on the measurement frequency.

For example, electrical impedance gradients of the series of electrical impedance measurements may be calculated with respect to the measurement frequency, with respect to a logarithm of the measurement frequency, or with respect to the index of the elements of the series of measurements. That is, a respective gradient at a respective index of the elements of the series of measurements may be calculated as the change in electrical impedance per change of the measurement frequency, per change of the logarithm of the measurement frequency, or per change of the index of the elements of the series of measurements.

For example, for a respective element of the series of electrical impedance measurements, a corresponding gradient may be calculated to express the change in the value of the electrical impedance measurements per change in the measurement frequency, per change in a logarithm of the measurement frequency, or per change in the index of elements, at the respective measurement frequency, the logarithm thereof, or at the respective index of elements. Thus, the gradient may be calculated for a series of discrete electrical impedance measurements. Calculating the gradient may correspond to differentiating a continuous electrical impedance curve with respect to the measurement frequency, or with respect to the logarithm of measurement frequency or the index of elements of the series of measurements. For example, for a respective element of the series of electrical impedance measurements, a corresponding gradient may be calculated based on a difference between the element and a neighboring element of the series of electrical impedance measurements, divided by the difference in the respective indices of elements or in the respective measurement frequencies.

For example, calculating gradients of the series of electrical impedance measurements may include calculating gradients of the real part and gradients of the imaginary part of the series of electrical impedance measurements.

In one or more embodiments, the method further comprises: providing battery voltage measurements of the electrochemical battery, the battery voltage measurements including a first voltage measurement being measured before or at the beginning of the electrical impedance measurements being measured, and including a second voltage measurement being measured after or at the end of the electrical impedance measurements being measured, wherein the artificial neural network means is configured to receive as further inputs the provided battery voltage measurements, wherein the artificial neural network means receives and processes at least the provided series of electrical impedance values and the provided battery voltage measurements to generate therefrom the output signal representing a temperature associated with the electrochemical battery.

Thus, further information that may be directly measured is made available for evaluation by the artificial neural network means.

In one or more embodiments, the artificial neural network means include a deep neural network. A deep neural network has an input layer, more than one hidden layer, and an output layer.

In one or more embodiments, the artificial neural network means include a convolutional neural network (CNN).

Convolutional neural networks are known for classifying images, for example. A convolutional neural network has an input layer, at least one convolutional layer, and an output layer. A CNN may be a deep neural network.

A neural network such as a DNN or CNN may be trained for identifying patterns in the series of electrical impedance values and associating the patterns with respective battery temperatures. In particular, the neural network may be configured (trained) to associate patterns with a same battery temperature, which patterns correspond to different states of charge but correspond to a same temperature.

In one or more embodiments, the method comprises: measuring the electrical impedance of an electrochemical battery at different measurement frequencies to provide the series of electrical impedance measurements, using electrical impedance measuring means.

For example, the series of electrical impedance measurements may be provided based on the measured electrical impedance at the different measurement frequencies.

The electrical impedance measurements may be measured in any order and/or concurrently for the respective measurement frequencies.

For example, the electrical impedance measuring means may be configured to input a signal including a respective frequency to the electrochemical battery, and determine a ratio of amplitude and phase of a response signal of the same frequency to the amplitude and phase of the input signal, the frequency of the signal and of the response signal corresponding to the measurement frequency.

For example, the electrical impedance measuring means may be electrical impedance spectroscopy measuring means configured for measuring electrical impedance of an electrochemical battery at a series of measurement frequencies. That is, the electrical impedance of the electrochemical battery is measured according to a process of electrochemical impedance spectroscopy.

Using electrochemical impedance spectroscopy, electrochemical processes in the electrochemical battery are characterized by electrical measurements that characterize the AC response of the electrochemical battery to an applied AC signal. The chemical processes in the battery, in addition to the structural configuration and the configuration of the connectors, lead to characteristic frequency dependencies of the measured impedance.

During the measurement of an electrical impedance at a specific measurement frequency, a DC offset signal (an offset voltage or an offset current) or DC bias signal may be applied to the battery, which is modulated by the AC signal of the measurement frequency.

For example, the series of electrical impedance measurements may be received from an independent measuring circuit or electrical impedance measuring means. However, a battery temperature estimating system may as well include electrical impedance measuring means for measuring and providing the series of electrical impedance measurements from an electrochemical battery.

For example, the electrochemical battery may be a lithium-ion battery or a lead-acid battery.

According to an aspect of the invention, there may be provided a computer-implemented method of monitoring a temperature of an electrochemical battery. The monitoring method may include the steps of the method of estimating a temperature.

For example, the method may be implemented in a battery monitoring system for monitoring a temperature of an electrochemical battery.

For example, the method may be implemented in a battery charging system for recharging a rechargeable electrochemical battery.

According to an aspect of the invention, there is provided a temperature estimating system for estimating a temperature of an electrochemical battery, the system comprising means for carrying out the steps of the method.

For example, the system may be or may be comprised in a system for monitoring a temperature of an electrochemical battery.

For example, the system may be or may be comprised in a battery charging system for recharging a rechargeable electrochemical battery.

In one or more embodiments, the temperature estimating system further comprises: electrical impedance measuring means configured for measuring the electrical impedance of an electrochemical battery at different measurement frequencies to provide the series of electrical impedance measurements.

In one or more embodiments, the temperature estimating system further comprises: a voltage measuring unit configured for measuring a battery voltage of the electrochemical battery to provide battery voltage measurements of the electrochemical battery, the battery voltage measurements including a first voltage measurement being measured before or at the beginning of the electrical impedance measurements being measured, and including a second voltage measurement being measured after or at the end of the electrical impedance measurements being measured, wherein the artificial neural network means is configured to receive as further inputs the provided battery voltage measurements, wherein the artificial neural network means is configured to receive and process at least the provided series of electrical impedance values and the provided battery voltage measurements to generate therefrom the output signal representing a temperature associated with the electrochemical battery.

BRIEF DESCRIPTION OF THE DRAWINGS

Preferred embodiments of the invention will now be described in conjunction with the drawings, in which.

DETAILED DESCRIPTION

Figure 1:
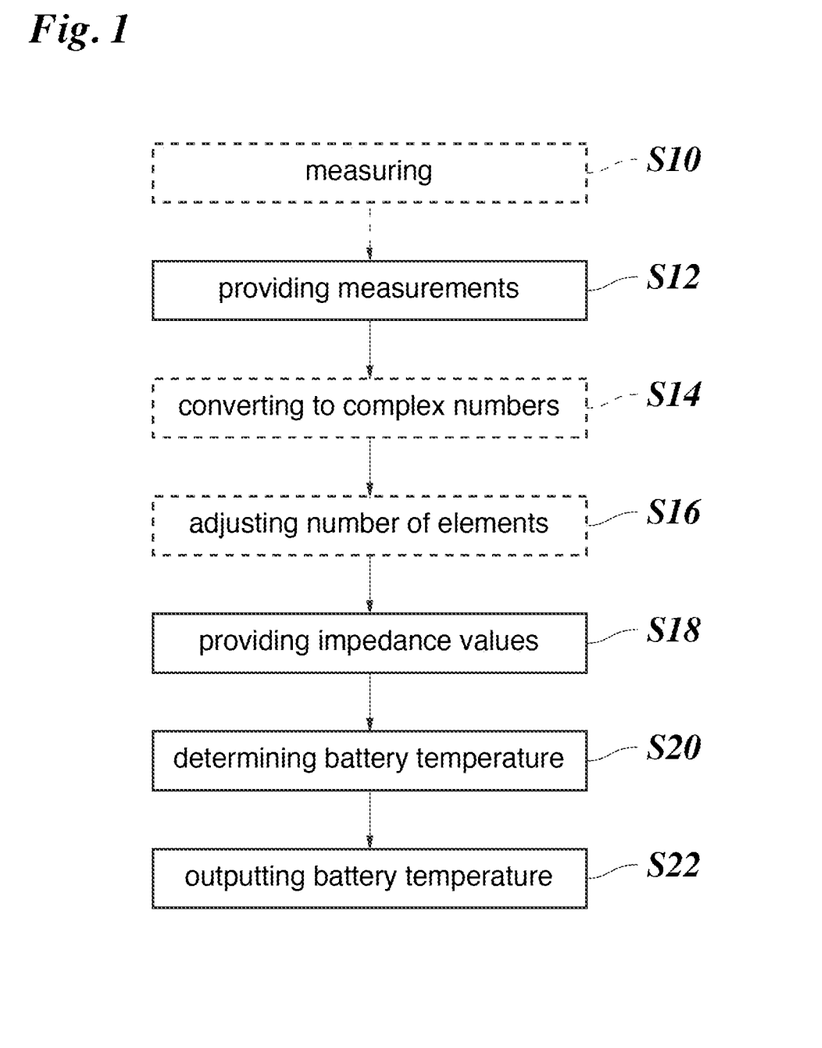
FIG. 1 is a schematic illustration of a method of estimating a temperature of a rechargeable electrochemical battery.

FIG. 1 schematically shows a computer-implemented method of estimating a temperature of a rechargeable electrochemical battery, for example, a lithium-ion battery. For example, the method may be performed by a temperature estimating system as described further below with respect to FIG. 5.

Step S10 is a step of measuring the electrical impedance of the electrochemical battery at different measurements frequencies, using electrical impedance measuring means.

From measuring the electrical impedance, in step S12, a series of electrical impedance measurements of the electrochemical battery is provided in form of a digital signal, for example, as a data set. The series is ordered according to the respective measurement frequencies, preferably in the order of increasing measurement frequencies.

However, the method may also start with step S12 of providing the measurements, which may have been measured independently from the method, and may have been communicated to a computer performing the method.

In case the provided electrical impedance measurements are not yet in the form of complex numbers (representing complex impedance), the method may include an optional step S14 of converting the provided electrical impedance measurements to complex numbers.

In an optional step S16, the number of elements of the series of electrical impedance measurements is adjusted to a predetermined number of elements, for example, to a number of 21 elements.

In step S18, the series of electrical impedance measurements is provided as a series of electrical impedance values to artificial neural network means, configured to receive as inputs the series of electrical impedance values.

In step S20, the artificial neural network means process the series of electrical impedance values to generate therefrom an output signal representing the battery temperature. Thus, a battery temperature of the electrochemical battery is determined, based on the series of electrical impedance values. In step S22, the battery temperature is output.

Figure 2:
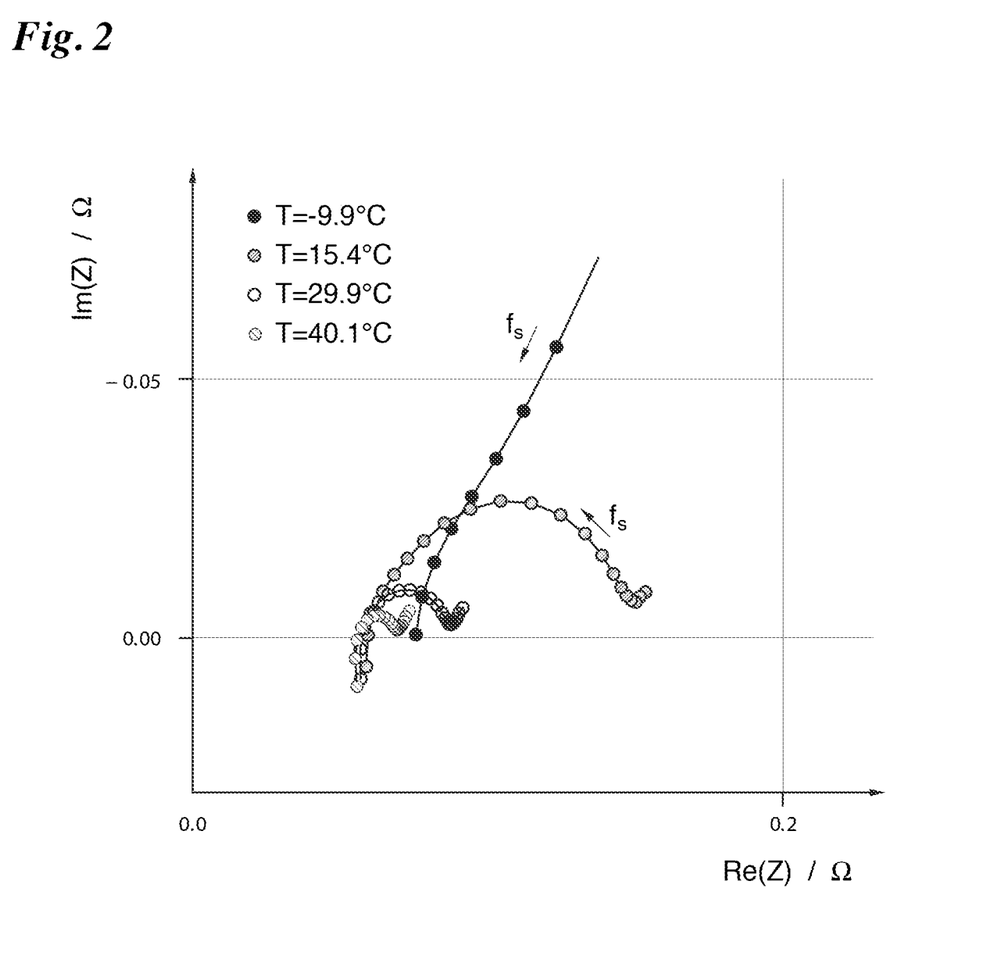
FIG. 2 is a schematic graph showing series of electrical impedance measurements of a rechargeable electrochemical battery measured at respective measurement frequencies and at respective battery temperatures.

FIG. 2 exemplarily shows four series of electrical impedance measurements measured at respective temperatures T of a battery. Each series includes electrical impedance measurements measured at respective measurement frequencies $f_s$. The measurements of each series are indicated by circles having respective patterns.

FIG. 2 is a Nyquist diagram in the form of a two-dimensional graph of the imaginary part Im(Z) and the real part Re(Z) of the electrical impedance Z. For illustration purposes, the elements of the series are connected by a line. According to convention, the imaginary part is displayed in an inversed direction, with the imaginary part increasing towards the bottom of FIG. 2. In FIG. 2, an arrow $f_s$ exemplarily shows the order of the measurements with increasing measurements frequency $f_s$.

Preferably, the measurements are taken at logarithmically progressing measurement frequencies. Preferably, the series of measurements comprises at least 4 (four) measurements per decade of the measurement frequency range. In FIG. 2, the electrical impedance measurements of the series of electrical impedance measurements are schematically indicated for illustration purposes, only. The number of measurements illustrated in FIG. 2 may deviate from the number of measurements that are actually used, and is for illustration purposes, only.

As FIG. 2 illustrates, for different temperatures T, the curves of the series of electrical impedance measurements in the complex plane show a large variation. Generally, the variation is highly non-linear with respect to the temperature T.

Figure 3:
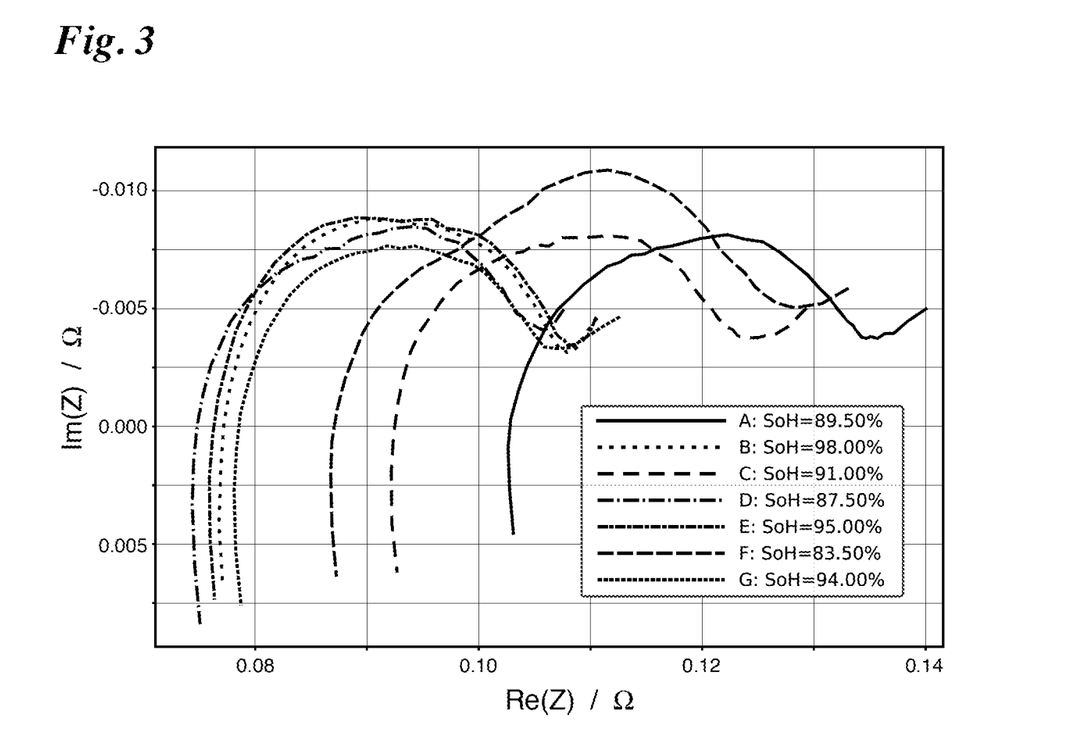
FIG. 3 is a schematic graph showing series of electrical impedance measurements of a rechargeable electrochemical battery measured at respective measurement frequencies and at respective states of health of a battery.

The multiple series of measurements shown in FIG. 2 correspond to different temperatures but equal or similar states of health of the battery. However, as shown in FIG. 3, different series A to G of electrical impedance measurements are provided for different states of health (SoH), at a same or similar temperature and a same or similar state of charge (SoC). FIG. 3 schematically shows series of electrical impedance measurements measured at different states of health of a battery. The series are schematically shown by continuous lines.

Thus, the curve progression of the electrical impedance measurements varies in dependency on the temperature as well as the state of health of the battery.

In addition to the series of electrical impedance values, a series of electrical impedance gradients may be provided as further inputs to the artificial neural network means.

Figure 4:
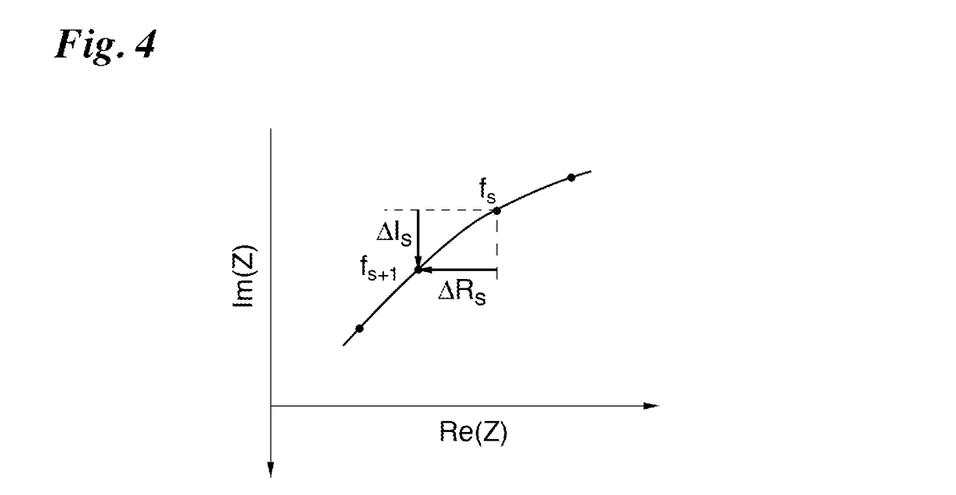
FIG. 4 is a schematic illustration of determining a gradient of the electrical impedance.

FIG. 4 schematically shows a part of a series of electrical impedance measurements, which are connected by a line. The series includes a first measurement taken at a measurement frequency $f_s$, and a second measurement taken at a measurement frequency $f_{s+1}$, wherein s and s+1 denote the respective indices of the series of measurements. The real part and the imaginary part of the difference between the measurements are indicated as $\Delta R_s$, $\Delta I_s$.

For the respective measurement frequency $f_s$, the electrical impedance gradient with respect to the measurement frequency is calculated as follows: the real part of the electrical impedance gradient is calculated as: $\Delta R_s/(f_{s+1}-f_s)$; the imaginary part of the electrical impedance gradient is calculated as: $\Delta I_s/(f_{s+1}-f_s)$.

Thus, gradients of the series of electrical impedance measurements with respect to the measurement frequency are calculated to generate a series of electrical impedance gradients.

In a further embodiment, the gradients may be calculated with respect to the index s of the elements of the series of measurements as follows: the real part of the electrical impedance gradient may be calculated as: $\Delta R_s/((s+1)-s) = \Delta R_s$; the imaginary part of the electrical impedance gradient may be calculated as: $\Delta I_s/((s+1)-s) = \Delta I_s$.

In a still further embodiment, the gradients may be calculated with respect to a logarithm of the measurement frequency as follows: the real part of the electrical impedance gradient is calculated as: $\Delta R_s/(\log_B(f_{s+1}) - \log_B(f_s))$; the imaginary part of the electrical impedance gradient is calculated as: $\Delta I_s/(\log_B(f_{s+1}) - \log_B(f_s))$; wherein $\log_B$ is the logarithm to the base B; for example, B=10.

Figure 5:
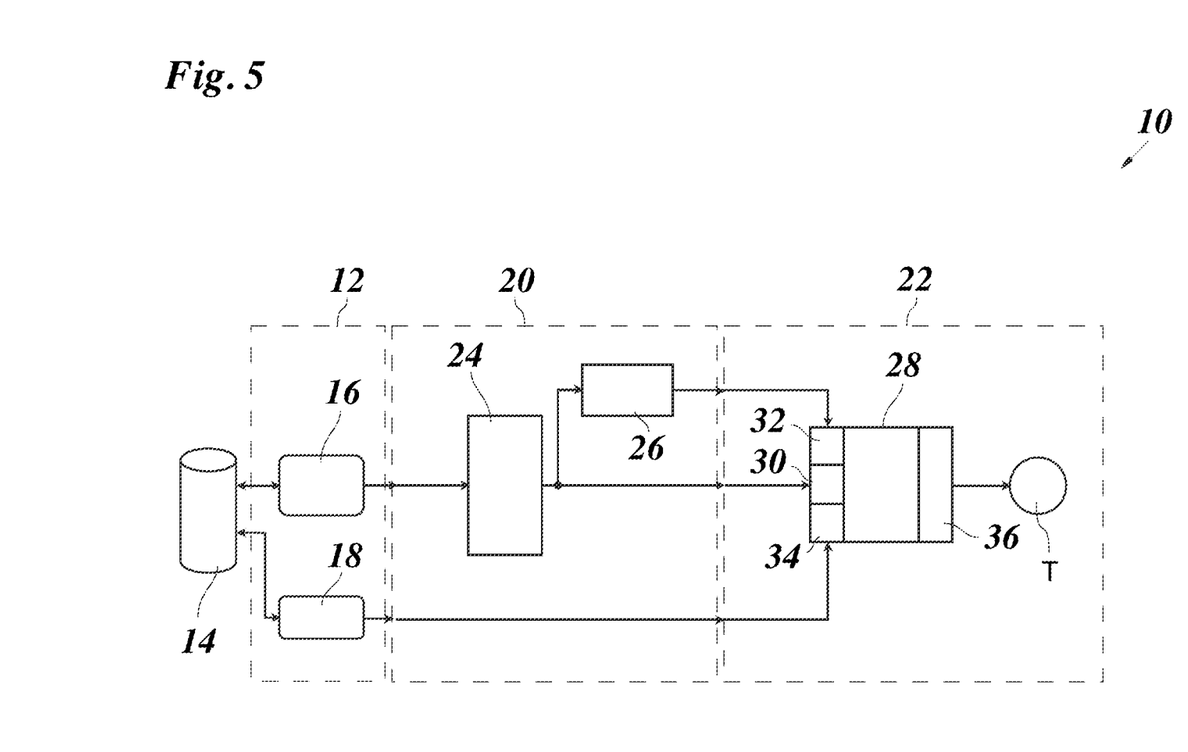
FIG. 5 is a schematic illustration of a system for estimating a temperature of a rechargeable electrochemical battery.

FIG. 5 schematically shows an example of a battery temperature estimating system 10 configured for performing the method of FIG. 1, the system optionally including electrical impedance measuring means 12. For example, the battery temperature estimating system 10 may be implemented in a computer, such as a microcontroller. For example, the microcontroller including the system 10 and, optionally, the electrical impedance measuring means 12 may be part of a battery monitoring system for monitoring a battery temperature of an electrochemical battery 14.

The electrical impedance measuring means 12 includes an electrical impedance measuring unit 16 and a voltage measuring unit 18. The battery temperature estimating system 10 further includes a pre-processing unit 20 and computational means 22.

For a series of measurement frequencies $f_s$, the electrical impedance measuring unit 12 applies an excitation signal, for example a sinusoidal signal of the respective measurement frequency $f_s$, to an electrochemical battery 14 that is to be measured. The signal is input in the form of a small amplitude alternating current (AC) signal, and the alternating current response from the battery 14 is measured. For example, a current signal is input, and a voltage response signal is measured. Alternatively, a voltage signal is input, and a current response signal is measured. During the measurements, a direct current (DC) bias voltage or DC bias current may be applied in accordance with the type of the electrochemical battery 14. The measuring setup corresponds to electrochemical impedance spectroscopy (EIS) measurement setups known as such. The measurement frequencies are arranged or increased in equidistant steps on a logarithmic scale, for the respective measurements, in accordance with a measurement setup that is predetermined for the electrochemical battery 14.

The measured electrical impedance at a specific measurement frequency is the ratio of the amplitude and phase of the AC response signal to the amplitude and phase of the input signal and is represented as a complex number (complex impedance). For example, four different measurements frequencies may be used per decade of the measurement frequencies.

In addition, the voltage unit 18 measures the overall battery voltage of the battery 14 before and after the electrical impedance measurements. In particular, the overall battery voltage may be a respective DC voltage.

The pre-processing unit 20 includes standardizing means 24 for providing the series of electrical impedance measurements from the electrical impedance measurement means 12 and for adjusting the number of elements of the series of electrical impedance measurements to a predetermined number of elements, for example, 21 elements. For example, the number of elements may be adjusted by interpolating the elements of the series. In case that the series of electrical impedance measurements provided by the standardizing means 24 already has the target value of the predetermined number of elements, the standardizing means 24 maintains the number of elements.

The preprocessing unit 20 further includes gradient calculating means 26 that receive the standardized series of electrical impedance measurements from the standardizing means 24. The gradient calculating means 26 calculate gradients of the series of electrical impedance measurements with respect to the measurement frequency to generate a series of electrical impedance gradients, similar to what has been explained above with respect to FIG. 4. Thus, the gradient calculating means 26 generate a series of electrical impedance gradients from the standardized series of electrical impedance measurements.

The computational means 22 include artificial neural network means 28 having first input means 30 for receiving the standardized series of electrical impedance measurements from the pre-processing unit 20 as a series of electrical impedance values.

Furthermore, the artificial neural network means 28 has second input means 32 for receiving the series of electrical impedance gradients from the gradient calculating means 26.

Furthermore, the artificial neural network means 28 has third input means 34 for receiving the measured battery DC voltages from the voltage measuring unit 18.

For example, the series of electrical impedance values, the series of electrical impedance gradients, and the measured battery DC voltages together may form an input (such as an input vector or input array) of the artificial neural network means 28.

Furthermore, the artificial neural network means 28 include output means 36 for outputting an output signal representing a battery temperature T associated with the electrochemical battery 14. The artificial neural network means 28 receives and processes the series of electrical impedance values, the series of electrical impedance gradients, and the measured battery DC voltages and generates therefrom the output signal.

For example, the artificial neural network means 28 may be a convolutional neural network (CNN), or a convolutional deep neural network. The artificial neural network means 28 has been trained to estimate a battery temperature T of the electrochemical battery 14 by detecting characteristic features of the series of electrical impedance values and the series of electrical impedance gradients, and the measured battery DC voltages. The determined battery temperature T is output by the output means 36.

The system may also be implemented with the artificial neural network means 28 having only the first input means 30 for receiving the standardized series of electrical impedance measurements, or having only the first input means 30 and, in addition, one of the second input means 32 and the third input means 34.

What is claimed is:

1. A computer-implemented method of estimating a temperature of an electrochemical battery, the method comprising:

receiving a series of electrical impedance measurements of an electrochemical battery measured at different measurement frequencies, the series of electrical impedance measurements ordered according to the respective measurement frequencies, and determining a temperature of the electrochemical battery using an artificial neural network configured to receive as inputs the series of electrical impedance measurements, wherein the artificial neural network receives and processes the series of electrical impedance measurements to generate an output signal representing a temperature associated with the electrochemical battery.

2. The method of claim 1, further comprising:

increasing a number of elements of the series of electrical impedance measurements to a predetermined number of elements by interpolating the electrical impedance measurements.

3. The method of claim 1, further comprising:

determining a series of electrical impedance gradients from the series of electrical impedance measurements, wherein the artificial neural network is configured to receive as further inputs the series of electrical impedance gradients, wherein the artificial neural network receives and processes at least the series of electrical impedance measurements and the series of electrical impedance gradients to generate the output signal.

4. The method of claim 1, further comprising:

receiving battery voltage measurements of the electrochemical battery, the battery voltage measurements including a first voltage measurement measured before or at beginning of measuring the electrical impedance measurements, and including a second voltage measurement measured after or at an end of measuring the electrical impedance measurements, wherein the artificial neural network receives and processes at least the series of electrical impedance measurements and the battery voltage measurements to generate the output signal.

5. The method of claim 1, wherein the artificial neural network comprises a deep neural network.

6. The method of claim 1, wherein the artificial neural network comprises a convolutional neural network.

7. A temperature estimating system for estimating a temperature of an electrochemical battery, the system comprising:

a processor; and a memory storing instructions thereon, the instructions when executed by the processor cause the processor to:

receiving a series of electrical impedance measurements of an electrochemical battery measured at different measurement frequencies, the series of electrical impedance measurements ordered according to the respective measurement frequencies, and determine a temperature of the electrochemical battery using an artificial neural network configured to receive as inputs the series of electrical impedance measurements, wherein the artificial neural network receives and processes the series of electrical impedance measurements to generate an output signal representing a temperature associated with the electrochemical battery.

8. The temperature estimating system of claim 7, wherein the instructions further cause the processor to:

receive battery voltage measurements of the electrochemical battery, the battery voltage measurements including a first voltage measurement measured before or at beginning of measuring the electrical impedance measurements, and including a second voltage measurement measured after or at an end of measuring the electrical impedance measurements, wherein the artificial neural network receives and processes at least the series of electrical impedance measurements and the battery voltage measurements to generate the output signal.

* * * * *